(12) United States Patent
Pramanick et al.

(10) Patent No.: US 8,082,541 B2
(45) Date of Patent: Dec. 20, 2011

(54) METHOD AND SYSTEM FOR PERFORMING INSTALLATION AND CONFIGURATION MANAGEMENT OF TESTER INSTRUMENT MODULES

(75) Inventors: Ankan Pramanick, San Jose, CA (US);
Jim Hanrahan, Los Altos, CA (US);
Mark Elston, Salinas, CA (US);
Toshiaki Adachi, San Jose, CA (US);
Leon L. Chen, San Jose, CA (US)

(73) Assignee: Advantest Corporation, Nerima-Ku, Tokyo (JP)

( * ) Notice: Subject to any disclaimer, the term of this patent is extended or adjusted under 35 U.S.C. 154(b) by 1289 days.

(21) Appl. No.: 11/100,109

(22) Filed: Apr. 5, 2005

(65) Prior Publication Data
US 2006/0130041 A1    Jun. 15, 2006

Related U.S. Application Data

(60) Provisional application No. 60/635,094, filed on Dec. 9, 2004.

(51) Int. Cl.
G06F 9/44    (2006.01)
G06F 9/45    (2006.01)
G06F 9/445    (2006.01)

(52) U.S. Cl. ......... 717/130; 717/124; 717/158; 717/177
(58) Field of Classification Search .......... None
See application file for complete search history.

(56) References Cited

U.S. PATENT DOCUMENTS

| | | | | |
|---|---|---|---|---|
| 5,450,586 A * | 9/1995 | Kuzara et al. | ......... | 717/124 |
| 5,903,758 A * | 5/1999 | Walker | ......... | 717/130 |
| 5,960,198 A * | 9/1999 | Roediger et al. | ......... | 717/130 |
| 6,182,275 B1 * | 1/2001 | Beelitz et al. | ......... | 717/175 |
| 6,662,357 B1 * | 12/2003 | Bowman-Amuah | ......... | 717/120 |
| 6,895,578 B1 * | 5/2005 | Kolawa et al. | ......... | 717/130 |
| 6,954,922 B2 * | 10/2005 | Liang | ......... | 717/130 |
| 6,957,422 B2 * | 10/2005 | Hunt | ......... | 717/130 |
| 7,111,282 B2 * | 9/2006 | Stephenson | ......... | 717/130 |
| 2003/0093772 A1 * | 5/2003 | Stephenson | ......... | 717/130 |
| 2003/0192031 A1 * | 10/2003 | Srinivasan et al. | ......... | 717/120 |
| 2004/0194064 A1 * | 9/2004 | Ranjan et al. | ......... | 717/124 |
| 2004/0225459 A1 | 11/2004 | Krishnaswamy et al. | | |

(Continued)

OTHER PUBLICATIONS

The Magazine for Professional Testers, [onilne], Dec. 2008 [retrieved on Sep. 30, 2011], pp. 29-35. Retrieved from the Internet:<URL: http://www.testingexperience.com/testingexperience04_08.pdf>.*

(Continued)

*Primary Examiner* — Thuy Dao
*Assistant Examiner* — Hanh Bui
(74) *Attorney, Agent, or Firm* — Morrison & Foerster LLP

(57) ABSTRACT

A method for managing multiple hardware test module versions, software components, and tester operating system (TOS) versions in a modular test system is disclosed. The method includes installing the TOS versions compatible with the modular test system in an archive and installing vendor software components corresponding to the hardware test module versions in the archive. The method further includes creating system profiles for describing vendor software components corresponding to the hardware test module versions and the TOS versions, selecting a system profile for the modular test system, where the system profile includes a set of compatible vendor software components and a selected TOS for testing a particular hardware test module version, and activating the selected TOS on the modular test system.

22 Claims, 9 Drawing Sheets

U.S. PATENT DOCUMENTS

| | | | |
|---|---|---|---|
| 2004/0225465 | A1 | 11/2004 | Pramanick et al. |
| 2005/0261855 | A1 | 11/2005 | Adachi et al. |
| 2005/0262412 | A1 | 11/2005 | Mukai et al. |
| 2005/0262414 | A1 | 11/2005 | Elston et al. |
| 2006/0130001 | A1* | 6/2006 | Beuch et al. ............ 717/130 |

OTHER PUBLICATIONS

Helmut K. Berg, Firmware Testing and Test Data Selection, [online], 1981 [retrieved on Sep. 30, 2011], pp. 75-80. Retrieved from the Internet: <URL: http://delivery.acm.org/10.1145/1510000/1500423/p75-berg.pdf>.*

International Search Report mailed on Mar. 20, 2006 for PCT Application No. PCT/JP2005/023004 filed Dec. 8, 2005, three pages.

Pramanick, A. et al. (Oct. 2004). "Test Programming Environment in a Modular, Open Architecture Test System," *IEEE* at ITC International Test Conference: Charlotte, NC, Oct. 26-28, 2004; Paper 14.2, pp. 413-422.

Rajsuman, R. (Jan. 2004). "An Overview of the Open Architecture Test System," *Proceedings of the Second IEEE International Workshop on Electronic Design, Test and Applications (DELTA'04)* at Second IEEE International Workshop: Perth, Australia, Jan. 28-30, 2004, pp. 1-6.

Stora, M. J. (Aug. 1999). "Structured Architecture for Test Systems (SATS) Hardware Interface Standards," *IEEE* at IEEE Systems Readiness Technology Conference: San Antonio, TX, Aug. 30-Sep. 2, 1999, pp. 707-718.

* cited by examiner

METHOD AND SYSTEM FOR PERFORMING INSTALLATION AND CONFIGURATION MANAGEMENT OF TESTER INSTRUMENT MODULES

CROSS-REFERENCE TO RELATED APPLICATIONS

This application claims the benefit of U.S. provisional application No. 60/635,094, "Method and System for Performing Installation and Configuration Management of Tester Instrument Modules" filed Dec. 9, 2004, which is assigned to the assignee of the present application and which is incorporated herein in its entirety by reference.

FIELD OF THE INVENTION

The present invention relates to the field of testing integrated circuits. In particular, the present invention relates to a method and system for performing installation and configuration management of tester instrument modules.

BACKGROUND OF THE INVENTION

A major reason for the high cost of test equipment is the specialized nature of conventional tester architecture. Each tester manufacturer has a number of tester platforms that are not only incompatible across companies such as Advantest, Teradyne and Agilent, but also incompatible across platforms within a company, such as the T3300, T5500 and T6600 series testers manufactured by Advantest. Because of these incompatibilities, each tester requires its own specialized hardware and software components, and these specialized hardware and software components cannot be used on other testers. In addition, a significant effort is required to port a test program from one tester to another, and to develop third party solutions. Even when a third party solution is developed for a platform, it cannot be ported or reused on a different platform. The translation process from one platform to another is generally complex and error prone, resulting in additional effort, time and increased test cost.

Another problem of the specialized tester architecture is that all hardware and software remain in a fixed configuration for a given tester. To test a device-under-test (DUT) or an IC, a dedicated test program is developed that uses some or all of the tester capabilities to define the test data, signals, waveforms, and current and voltage levels, as well as to collect the DUT response and to determine whether a DUT has passed or failed a test.

An open architecture test system provides a solution to the above problems of the traditional test system. An example of an open architecture test system is described in U.S. application Ser. No. 10/772,434, "Method and Structure to Develop a Test Program for Semiconductor Integrated Circuits", which is incorporated herein in its entirety by reference. The open architecture test system can be configured to support a wide variety of vendor hardware test modules and their corresponding DUTs.

However, one of the challenges in implementing such an open architecture test system is that there may be multiple versions of tester operating systems (TOSs). In addition, each vendor hardware test module may have multiple versions and each version of the vendor hardware test module may have its corresponding versions of software components. The versions of the tester operating systems, vendor hardware test modules, and software components need to work together seamlessly in order to run tests on the vendor hardware test modules. Therefore, there is a need for a modular test system that can manage multiple vendor hardware test module versions, software components versions, and TOS versions for testing DUTs using the wide variety of vendor hardware test modules.

SUMMARY

In one embodiment, a method for managing multiple hardware test module versions, software components, and tester operating system (TOS) versions in a modular test system includes installing the TOS versions compatible with the modular test system in an archive and installing vendor software components corresponding to the hardware test module versions in the archive. The method further includes creating system profiles for describing vendor software components corresponding to the hardware test module versions and the TOS versions, selecting a system profile for the modular test system, where the system profile includes a set of compatible vendor software components and a selected TOS for testing a particular hardware test module version, and activating the selected TOS on the modular test system.

In another embodiment, a system for managing multiple hardware test module versions, software components, and tester operating system (TOS) versions includes a system controller for controlling at least one site controller, at least one site controller for controlling at least one hardware test module, test operating system versions compatible with the modular test system, vendor software components corresponding to the hardware test module versions, and a system profile for describing vendor software components corresponding to the hardware test module versions and the TOS versions.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

DESCRIPTION OF EMBODIMENTS

Methods and systems are provided for performing installation and configuration management of tester instrument modules. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1A:
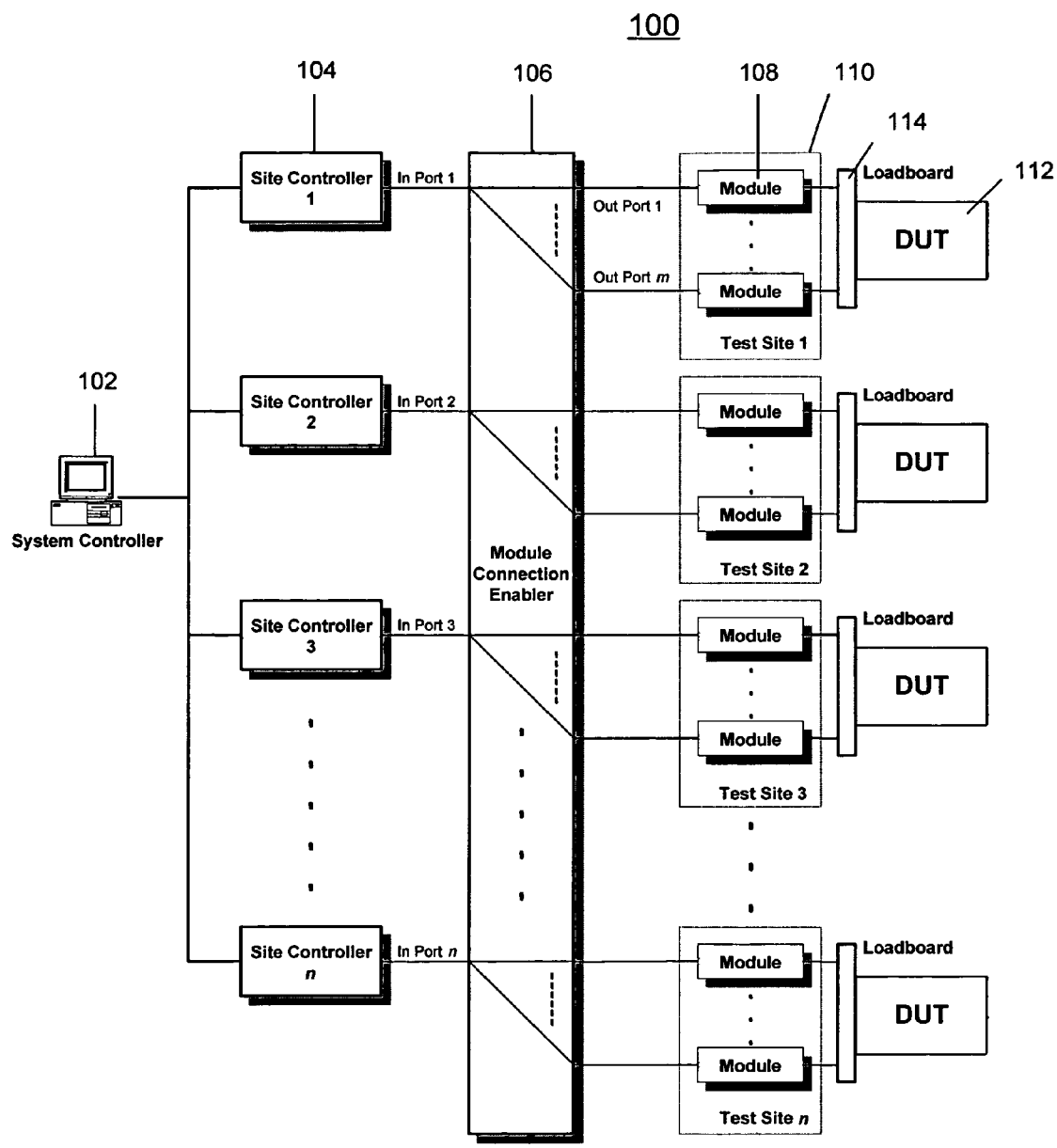
FIG. 1a illustrates an open architecture test system according to an embodiment of the present invention.

FIG. 1a illustrates an open architecture system according to an embodiment of the present invention. As shown in FIG. 1a, a system controller (SysC) 102 is coupled to multiple site controllers (SiteCs) 104. The system controller may also be coupled to a network to access files. Through a module connection enabler 106, each site controller is coupled to control one or more test modules 108 located at a test site 110. The module connection enabler 106 allows reconfiguration of connected hardware modules 108 and also serves as a bus for data transfer (for loading pattern data, gathering response data, providing control, etc.). Possible hardware implementations include dedicated connections, switch connections, bus connections, ring connections, and star connections. The module connection enabler 106 may be implemented by a switch matrix, for example. Each test site 110 is associated with a device under test (DUT) 112, which is connected to the modules of the corresponding site through a loadboard 114. In one embodiment, a single site controller may be connected to multiple DUT sites.

The system controller 102 serves as the overall system manager. It coordinates the site controller activities, manages system-level parallel test strategies, and additionally provides for handler/probe controls as well as system-level data-logging and error handling support. Depending on the operational setting, the system controller 102 can be deployed on a CPU that is separate from the operation of site controllers 104. Alternatively a common CPU may be shared by the system controller 102 and the site controllers 104. Similarly, each site controller 104 can be deployed on its own dedicated CPU (central processing unit), or as a separate process or thread within the same CPU.

The system architecture can be conceptually envisioned as the distributed system shown in FIG. 1a with the understanding that the individual system components may also be regarded as logical components of an integrated, monolithic system, and not necessarily as physical components of a distributed system.

Figure 1B:
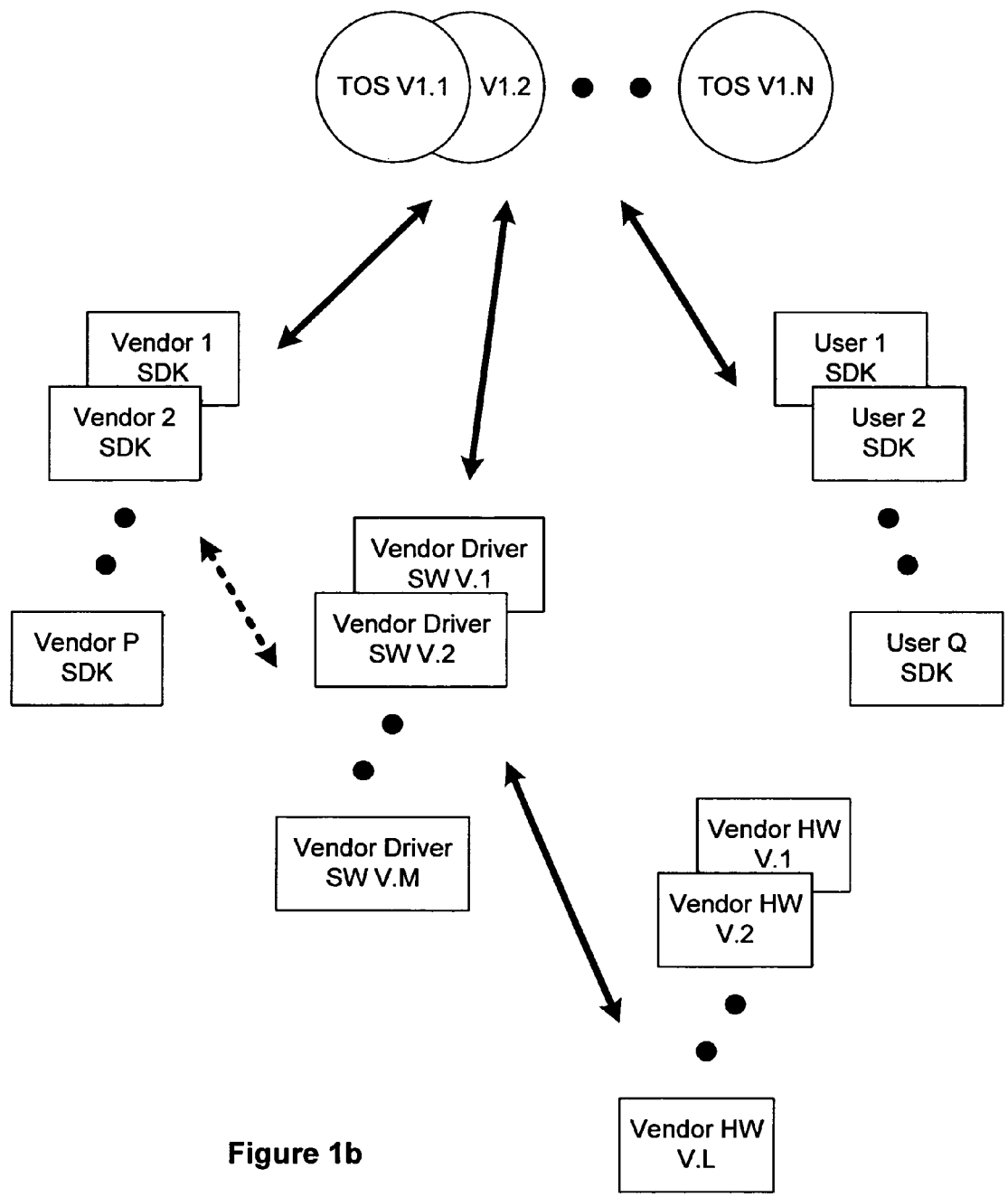
FIG. 1b illustrates a method for managing multiple hardware test module versions, software components, and TOS versions in a modular test system according to an embodiment of the present invention.

FIG. 1b illustrates a method for managing multiple hardware test module versions, software components, and TOS versions in a modular test system. Multiple versions of the TOS and its associated versions of user and vendor SDKs, as well as multiple versions of Vendor Driver software are stored in an archive. The purpose of the open architecture test system Installation and Configuration Management (ICM) system is to allow Vendors to develop Driver software components to support their hardware modules and to allow users to select compatible Vendor Driver software and TOS versions for operation on a tester or development platform. The ICM system also manages installing these selected configurations on the tester or development platform and, optionally, activating the selected configurations.

The ICM system describes the requirements for and activities involved in managing the open architecture test system's TOS. The ICM for an open architecture test system involves four principle activities:
1. Installation
    This refers to the act of copying open architecture test system components to an archive for later activation or deployment.
2. Configuration
    This refers to the act of allowing the user to interact with the ICM system to create, save and modify the software configuration as system profiles, which are used for activation.
3. Activation
    This refers to the act of making a chosen software configuration (i.e., a profile) the active one on a particular tester, i.e., deploying it.
4. Audit
    This refers to the act of providing a listing of currently active software and hardware components on a particular test system.

This document provides specifications for each of these activities. In the discussion to follow, the well-known abbreviations SW and HW are used to refer to software and hardware, respectively.

Note that while installation and configuration are ICM-specific activities (that can conceptually be performed remote to a particular tester), activation and audit are tester-specific, and need cooperation from certain open architecture test system's TOS components, principally the open architecture test system's Tester Control Daemon (TCD). Hence, this document also describes the facets of the TCD and the TOS that are involved in the ICM activities, as well as the installation of the TCD itself. Towards this end, the tester control and TOS startup section first provides a description of open architecture tester control and TOS system startup procedures.

Also note that releases of open architecture test system software "patches" are an essential part of fixing and enhancing open architecture test system software components in-between more comprehensive software releases. Towards this end, the software patch releases section provides a description of the methods followed in creating, distributing and using open architecture test system software patch releases.

Tester Control and TOS Startup

In this section, we describe open architecture tester control and startup procedures. It is assumed that the reader is familiar with the fundamentals of open architecture tester architecture, as presented in, especially the organization of the TOS as a general distributed system comprising the open architecture test system's System Controller (SysC) and Site Controller(s) (SiteCs).

Tester Control Daemon

The general control of the open architecture test system's TOS is performed by the open architecture test system's Tester Control Daemon (TCD). The specification for the TCD is summarized as follows:

The open architecture test system's Tester Control Daemon is responsible for the following functions:
   Startup and initialization of the open architecture test system's TOS at system boot-up or on user command and optional startup of user-defined open architecture test system applications after successful system initialization.
   Shutdown of the open architecture test system's TOS on user command, including the shutdown of any open architecture test system applications that are connected to the TOS core services.

Activation or deployment of a particular software configuration for open architecture test system, as defined by a system profile, where a "version switch" is essentially the activation of a profile other than the one currently in effect.

The system profile for an open architecture test system software configuration is described below, which is the total collection of information necessary to define a particular open architecture test system software configuration. For the rest of the discussion, the tester control daemon is referred to as used in a Windows operating system (OS); the concepts, however, are general and applicable to any open architecture test system.

The TCD in a Windows system is a Win32 service (it appears in the list of installed services in the Services dialog box, available using the Windows Control Panel), that is installed and automatically run on the SysC and all SiteCs. It is a COM component that provides interface methods (on the System Controller side) to perform the above functions. It is installed separately from the open architecture test system software (online versions being factory installed by the system integrator), and registered with the Windows service control manager for automatic startup at OS boot time. Note that while the main TCD is the one running on the System Controller, auxiliary TCDs run on the Site Controllers, and are responsible for working under the aegis of the main TCD to bring up the individual Site Controllers.

TOS Control and Factory Defaults Directories

Figure 2A:
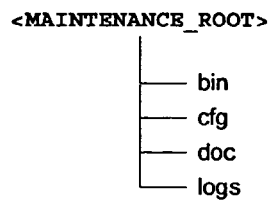
FIG. 2a illustrates a TOS control and factory defaults directory structure according to an embodiment of the present invention.

For the daemon to be installed and function properly, every open architecture test system is pre-configured with a standard directory structure for housing TOS control components and factory defaults information. This is summarized as the following specification:

Every open architecture test system's System Controller and Site Controller is configured to have a TOS control and factory defaults directory structure, rooted at a location <MAINTENANCE_ROOT> that is available, and having a structure as shown in FIG. 2a and described in Table 1.

Table 1 describes the structure shown in FIG. 2a. Note that the directories listed in the first column are relative to <MAINTENANCE_ROOT>.

TABLE 1

TOS Control and Factory Defaults Directory Contents

| Directory | Description |
|---|---|
| ./bin | Contains a TCD controller application, and associated dynamic link libraries (DLLs). |
| ./cfg | Contains configuration files specifying the factory default setting for the tester. |
| ./doc | Contains TCD and factory defaults related documentation; may be separated into subdirectories by category of document. |
| ./logs | Location where the TCD installer logs its operation. |

The TCD controller application installed in <MAINTENANCE_ROOT>/bin is intended to be a simple command-line application that can send the basic tester system control commands, such as "start", "stop", "activate", etc. to the TCD. The Advantest T2000 system comes with the application t2kctrl to perform these tasks.

The contents of the <MAINTENANCE_ROOT>/cfg directory may vary from system integrator to system integrator; in each case, it contains tester information that is needed by the corresponding TCD or its installer to function. For example, the Advantest T2000 tester system places the following information in <SystemDrive>:/T2000Maintenance/cfg. Note that <SystemDrive> is an environment variable pre-defined by Windows; by default, it is "C:" on Windows 2000.

The factory configuration of the Site Controllers (in a standard Windows INI file format) that specifies the internal system IP names and addresses of all the Site Controllers provided at the factory, together with any special open architecture test system user account and password information necessary for the open architecture test system software activation process to perform its duties. This file is named OASISSiteInfo.ini.

The user may not modify this file on an online system. For an offline system, the user may modify this, if desired, from the default (which designates a single SiteC on the same machine as the SysC). For a system that is used both online and offline, the online mode need to use the original online factory configuration file (or one that has most recently been updated by a factory-authorized technician to reflect changes in the hardware layout).

A factory defaults specification (FDEF) file, containing information about
  overall tester properties, such as type, name, operating frequency, etc.,
  the factory configured hardware modules and their board-specific details,
  the factory configured open architecture test system module connection enabler (MCE) ports the hardware modules are connected to,
  the open architecture test system synchronization matrix connections to each hardware module (if any), and
  the test head connections for the hardware modules.

The user may not modify this file on an online system—modifications may only be made by authorized maintenance personnel who change the physical configuration of the machine. For an offline system, the factory defaults specification file defines a virtual machine configuration that is compatible with test examples provided, if any; the user may modify this, if desired, to configure his/her own virtual tester. For a system that is used both online and offline, the online mode need to use the original online factory configuration file (or one that has most recently been updated by a factory-authorized technician to reflect changes in the hardware layout).

Tester States and State Transitions

As mentioned above, the TCD is responsible for starting the open architecture test system's TOS. In order to understand the mechanism of TOS bring-up, it is necessary to first understand the states the TOS can be in, and the transitions that are allowed between them. The state transition diagram for an open architecture tester is shown in FIG. 2b.

Figure 2B:
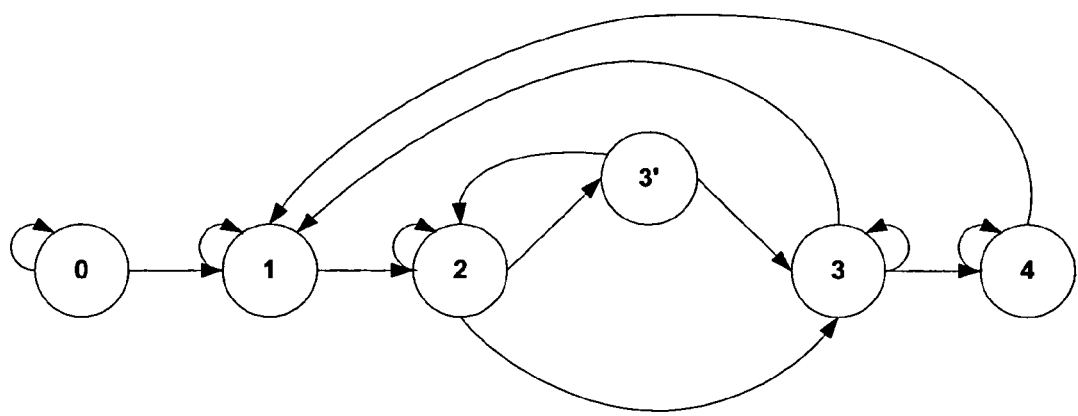
FIG. 2b illustrates a state diagram of the open architecture test system according to an embodiment of the present invention.

The meanings of the states in FIG. 2b are as follows:

State 0: The tester system is Idle: The TCD on the System Controller is not running and the TOS is not running.

State 1: The TCD is running on at least the System Controller; however, the TOS is not yet functional.

State 2: The open architecture test system's System Controller process is running, but has not yet been initialized; TCDs may or may not be running on all Site Controllers; in offline mode, the open architecture test system's tester emulator process is not yet running.

State 3': (Offline mode only) The open architecture test system's tester emulator is running on the (single designated) Site Controller computer.

State 3: At least Site Controller 1 (SITEC-1) has been successfully initialized, and the system is in default partitioned state (i.e., all hardware modules are connected, through the MCE, to SITEC-1); additionally, all designated Site Controllers may also have been successfully initialized. At this point, the system is "ready", i.e., configured to accept test plan load requests.

State 4: A user test plan has been successfully loaded on one or more compatible Site Controllers, as part of which the system may have been (re)partitioned to accommodate the test plan requirements.

The events causing the state transitions shown in FIG. 2b are described below, where the notation "t(x, y)" specifies a transition from State x to State y (note that the client referred to in the discussion below is a client of the System Controller TCD, and may be any application, remote or local, that connects and uses the proper interfaces on the TCD):

| | |
|---|---|
| t(0, 0) | On receipt of a command from the Windows boot process (or an interactive, manual "start" request), the Windows service control manager fails to start the TCD on the System Controller during Windows boot-up. |
| t(0, 1) | On receipt of a command from the Windows boot process (or an interactive, manual "start" request), the Windows service control manager successfully starts the TCD on the System Controller, and possibly on the Site Controllers. |
| t(1, 1) | On receipt of a client command to "start" the TOS, the TCD on the System Controller fails to start the TOS System Controller process. |
| t(1, 2) | On receipt of a client command to "start" the TOS, the TCD on the System Controller successfully starts the TOS System Controller process. |
| t(2, 2) | As part of the client command to "start" the TOS, initialization of the TOS System Controller process fails, i.e., it fails to start the open architecture test system's tester emulator process in the offline mode, or fails to start and initialize the TOS Site Controller process on at least SITEC-1. |
| t(2, 3') | (Offline mode only) As part of the client command to "start" the TOS, the TOS System Controller process successfully starts the open architecture test system's emulator process on the (single designated) Site Controller computer. |
| t(3', 3)* | (Offline mode only) As part of the client command to "start" the TOS, the TOS System Controller process successfully starts and initializes the TOS Site Controller process for at least SITEC-1 (and possibly processes for all the designated Site Controllers). |
| t(3', 2) | (Offline mode only) As part of the client command to "start" the TOS, the TOS System Controller process fails to start and initialize the TOS Site Controller process for at least SITEC-1 (the emulator process is terminated). |
| t(2, 3)* | (Online mode only) As part of the client command to "start" the TOS, the TOS System Controller process successfully starts and initializes the TOS Site Controller process on at least SITEC-1 (and possibly on all the designated Site Controllers). |
| t(3, 3) | On receipt of a user command to load a user test plan, the TOS fails to load the specified test plan. |
| t(3, 4) | On receipt of a user command to load a test plan, the TOS successfully loads the test plan on the designated Site Controller(s), after successfully (re)partitioning the system (if necessary) as per the requirements of the socket associated with the specified test plan. |
| t(4, 4) | On receipt of a user command to (re)load (the same or a different) test plan, the TOS successfully (re)loads the test plan on the designated Site Controller(s), after successfully (re)partitioning the system (if necessary) as per the requirements of the socket associated with the specified test plan. |
| t(3, 1) | On receipt of a client command to "shutdown" the TOS, the TCD stops the TOS. |
| t(4, 1) | On receipt of a client command to "shutdown" the TOS, the TCD stops the TOS after stopping a running test plan, if any. |

Note that * indicates the transition is accompanied by the TOS System Controller process attempting to start user-specified applications; a failure to start any or all of these applications does not constitute a failure of successful TOS initialization, since applications are not part of the TOS.

In addition to the transitions shown above, a Windows "shutdown" command executed on the System Controller (or a physical power-down of the system) resets the tester to State 0, regardless of the state it is in at that time.

TOS Startup Process

The process by which the open architecture test system's TOS is brought up is as follows (it is assumed that the environment variables OASIS_INSTALLATION_ROOT, OASIS_ACTIVE_CONFIGS, OASIS_TOS_SETUP_FILE, OASIS_TPL_SETUP_FILE, OASIS_TOOLS_SETUP_FILE, OASIS_MACHINE_DIR, and OASIS_TEMP have already been correctly defined, and system profile has been chosen):

1. On system power-on (or boot-up), the Windows service control manager starts the TCDs on the System and Site Controllers.
2. The TCD on the System Controller verifies that a system profile is in effect, reads the profile-specified configuration of the Site Controllers—i.e., the file $OASIS_ACTIVE_CONFIGS/OASISSys.cfg—and starts the TOS System Controller process.
3. The TCD then calls an initialize( ) method on the TOS System Controller process, which causes
   a. The tester emulator process to be started on the (single designated) Site Controller computer, if and only if the operation mode is offline;
   b. The TCD on each Site Controller to be requested to start its TOS Site Controller process;
   c. An initialize( ) method to be called on each TOS Site Controller process; and
   d. After at least SITEC-1 has been successfully initialized, the system to be default partitioned (where all hardware modules are connected, through the MCE, to SITEC-1).
4. The TCD then attempts to start, in the order specified, any user applications listed for automatic startup in the currently active profile.

A failure during any of the steps 1 3 leads to the corresponding system state transition as described above. A failure at step 1 or 2 is logged in the Windows event log. A failure at step 3 is logged with the TOS System Controller process, and is made available for later retrieval by any client application that connects to it.

Optional Automatic Application Startup

As discussed above, the open architecture test system provides for users to add applications that should be started up automatically following a successful TOS startup. The OCTool allows users to specify their choices of such applications as part of a system profile. When such a profile is activated (i.e., the configuration specified by that profile is made current) on a particular tester, step 4 above is executed at the completion of a successful TOS initialization.

To do this, the TCD reads a Startup section of the file OASISVer.cfg, which is the data file specifying the attributes of the chosen system profile, and is in standard windows INI file format. It treats each line in that section as a command line to launch a new application. A failure to launch any or all of the applications listed does not constitute an error condition as far as TOS bring-up is concerned, since applications are not part of the TOS. However, any such failures are noted and stored (for later retrieval by an application) in the TOS System Controller process.

Installation

Installation for the open architecture test system comprises the installation of three main components, each of which is installed independently:

1. The open architecture test system's Tester Control Daemon (TCD, which encapsulates the functionality of the open architecture test system software activation or deployment).

2. The open architecture test system's Configuration Tool (OCTool).
3. The open architecture test system's system software.

In this section, the installation process is described for each of these components.

TCD Installation

The open architecture test system's TCD package is installed independently of any other open architecture test system component. For a factory-fresh online system, the TCD package may typically be pre-installed. For offline systems and for updates to the TCD in general, an installer may be provided by the system integrator.

In Windows, the open architecture test system <MAINTENANCE_ROOT> naturally translates to a directory on the usual Windows <SystemDrive> (often the "C:" drive), since <SystemDrive> is guaranteed to exist. For example, the Advantest T2000 implementation of open architecture test system places the root at the directory "C:/T2000Maintenance" on the System and Site Controllers. In the discussion to follow, it is assumed that <SystemDrive> is "C:". The steps followed during the installation of the TCD package are as follows:

1. As described above, <MAINTENANCE_ROOT> exists on the SysC and SiteCs, since some components are installed in <MAINTENANCE_ROOT>.
   a. If <MAINTENANCE_ROOT> does not exist, the TCD installer creates it.
   b. If the site controller factory configuration file (C:/T2000Maintenance/cfg/OASISSiteInfo.ini in the Advantest T2000 system) does not exist, the installer also creates it, based on input from the person performing the installation.
   c. If the open architecture test system factory defaults specification (FDEF) file (C:/T2000Maintenance/cfg/OASISHW.def in the Advantest T2000 system) exists,
      i. for an online system, it is not replaced or modified in any way;
      ii. for an offline system, a pre-packaged version, named <FDEF-name>.<example>, meant to model a virtual tester compatible with the examples provided with the open architecture test system, is copied into <MAINTENANCE_ROOT>/cfg, and the user is reminded to replace the existing FDEF file with this one (if he wants to work with the open architecture test system examples).
   d. If the FDEF file does not exist,
      i. for an online system, a sample FDEF file is installed, and the user is warned to update it to be compatible with his installed hardware;
      ii. for an offline system, the pre-packaged version of this file is installed as the FDEF file (with the standard name as required by the open architecture test system)
2. The installer installs the TCD binaries in <SystemRoot>/system32, and set Windows registry entries for any required COM component registrations.
3. The installer sets the following configuration properties for the TCD:
   a. AutoStart: This specifies whether a Windows system boot causes the SysC TCD to automatically start the open architecture test system's TOS (TRUE) or not (FALSE). The default is TRUE; the person performing the installation may set it to FALSE, if desired.
   b. Mode: This specifies whether the TOS should be started in ONLINE (if applicable) or OFFLINE mode of operation. The default is ONLINE; and the person performing the installation may set it to OFFLINE, if desired.
   c. Configuration: This specifies whether the TOS should be started with DEBUG or RELEASE versions of components. The default is RELEASE; the person performing the installation may set it to DEBUG, if desired.
4. The installer installs the TCD controller application (t2kctrl), and its associated DLLs, in <MAINTENANCE_ROOT>/bin.
5. For each of the following operating system environment variables required by an open architecture test system, the installer (i) determines if it is already set, and, (ii) if not, sets it to a user-specified value:
   a. OASIS_INSTALLATION_ROOT
   b. OASIS_ACTIVE_CONFIGS
   c. OASIS_MACHINE_DIR
   d. OASIS_TEMP
6. The installer adds <MAINTENANCE_ROOT>/bin and $OASIS_INSTALLATION_ROOT/bin to the Windows system PATH environment variable (it is assumed that as per Windows conventions, <SystemRoot/system32 is already in the system PATH environment variable).

Note that as shown in Step1.d.ii above, the TCD and the DLLs it depends on are installed in the Windows <SystemRoot>/system32 directory (which is <SystemDrive>/WINNT/system32—most often, C:/WINNT/system32—on Windows 2000), since that location assures proper operation of a Windows service. In addition, <MAINTENANCE_ROOT> needs to be present on the System and Site Controllers for the system to function properly. Hence, <MAINTENANCE_ROOT> (and the TCD and its related DLLs in <SystemRoot>/system32) should be carefully backed up and restored if one desires to reformat the local disk on which these components reside. The activation of any system profile on an open architecture tester depends on the TCD having been installed and being available on the tester. Since the TCD is essentially independent of the open architecture test system software, it is required to be backward-compatible with all releases of open architecture test system software.

OCTool Installation

The open architecture test system Configuration Tool, OCTool, is distributed and installed in a separate package from the open architecture test system software.

The installer for the OCTool allows the user to choose an installation location for the OCTool. The OCTool allows the user to create and save open architecture test system's system profiles that are tester-independent. Thus, one may conceptually install it in a location remote to any particular tester, as long as it had access to the archive location where the open architecture test system software is installed. However, one need to be careful not to install it in a location that lies within the directory tree rooted at $OASIS_INSTALLATION_ROOT, which is the root of the currently active system, since it may then be lost as a result of activating the system corresponding to a different profile.

Like the TCD, since the OCTool is essentially independent of the open architecture test system software, it needs to be backward-compatible with all releases of open architecture test system software.

Open Architecture Test System Software Installation

Installation of the open architecture test system software refers to the act of physically copying open architecture test system software components (ultimately, files) into a location defined by the operating-system environment variable OASIS_ARCHIVE_ROOT. This location is henceforth referred to as the archive. The archive contains files that are provided by open architecture test system's vendors and system integrators for users of the system. Note that this is distinct from the deployment or runtime location. In contrast to the deployment location, the archive location can physically be remote from the tester system, as long as it is accessible by the TCD, which runs on the tester system the software is deployed on.

The installation process is identical for TOS and vendor components. Each installed file has a Component Configuration Record (CCR), which specifies the properties of the component. Thus, the following two requirements summarize the specification of the installation process:

Open architecture test system software installation copies files into a defined archive location. This location is specified by the environment variable OASIS_ARCHIVE_ROOT.

Each file installed to the archive is accompanied by a Component Configuration Record or CCR, which contains the required descriptive information for the file.

Thus, the TOS and vendor files reside under a common root. For these files to be managed via system profiles, they follow the open architecture test system file-naming requirements. By following these requirements, the files on the system may be accumulated in a single archive directory for management. This applies for both TOS and vendor installed files. These requirements are discussed next.

File Naming Requirements

To enable version management, switching and auditing, each component to be installed in an open architecture test system (i.e., each file) uses the following file-naming format, which prevents the names from colliding with those of other installed components from the same or different vendors:

TOS and vendor components use the following naming format: VendorID_ComponentName_[D_]VersionIdentifier[.ext].

The description of the format is as follows, where elements within square brackets ([ ]) represent optional items:

1. VendorID: A two to three-letter vendor identification code. This code distinguishes the component as a TOS or vendor-specific component, and provides for the disambiguation of files. Note that it is the responsibility of each vendor to manage the files they introduce into the system. The first character should be alphanumeric and can not be an underscore character. TOS runtime components use "OAI" as the identifier. The VendorID part is followed by an underscore character, '_'.
2. ComponentName: An arbitrary name as selected by component suppliers. The ComponentName part is followed by an underscore character, '_'.
3. D: This is optional, and applicable to executable components. For such components, ComponentName is followed by 'D', if and only if the component represents a debug dynamic link library (DLL) or executable (EXE). The absence of the 'D' implies that the component is a non-debug version (i.e. a "release" version). If present, the 'D' part is followed by an underscore character, '_'.
4. VersionIdentifier: Explicit versioning of all files introduced into the system is a fundamental requirement. To be compatible across different operating systems, the versioning is represented as part of the filename, as the VersionIdentifier field. This field has the following format:
major.minor.patch
where each of major, minor and patch are non-negative integer values, representing major minor and patch versions respectively of a component.
5. ext: Extensions are (optional) OS-specific identification aids, such as .dll, .exe, .txt, .doc, etc.

Figure 3:
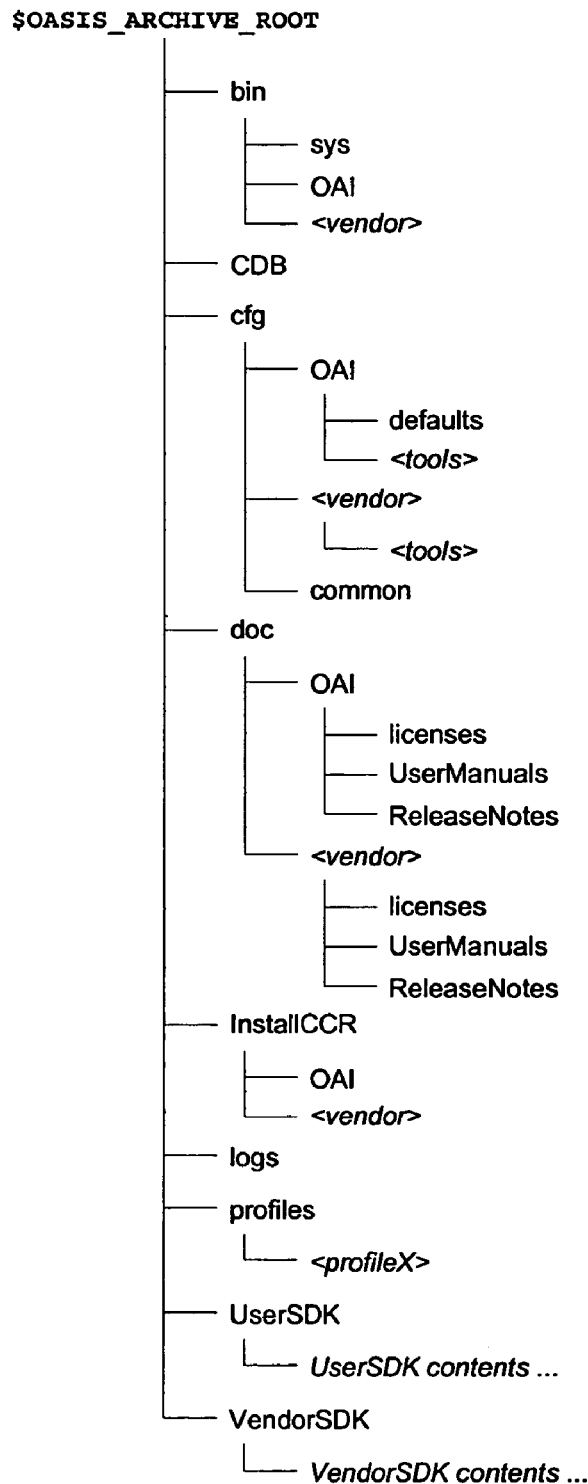
FIG. 3 illustrates a TOS installation directory structure according to an embodiment of the present invention.
Figure 4:
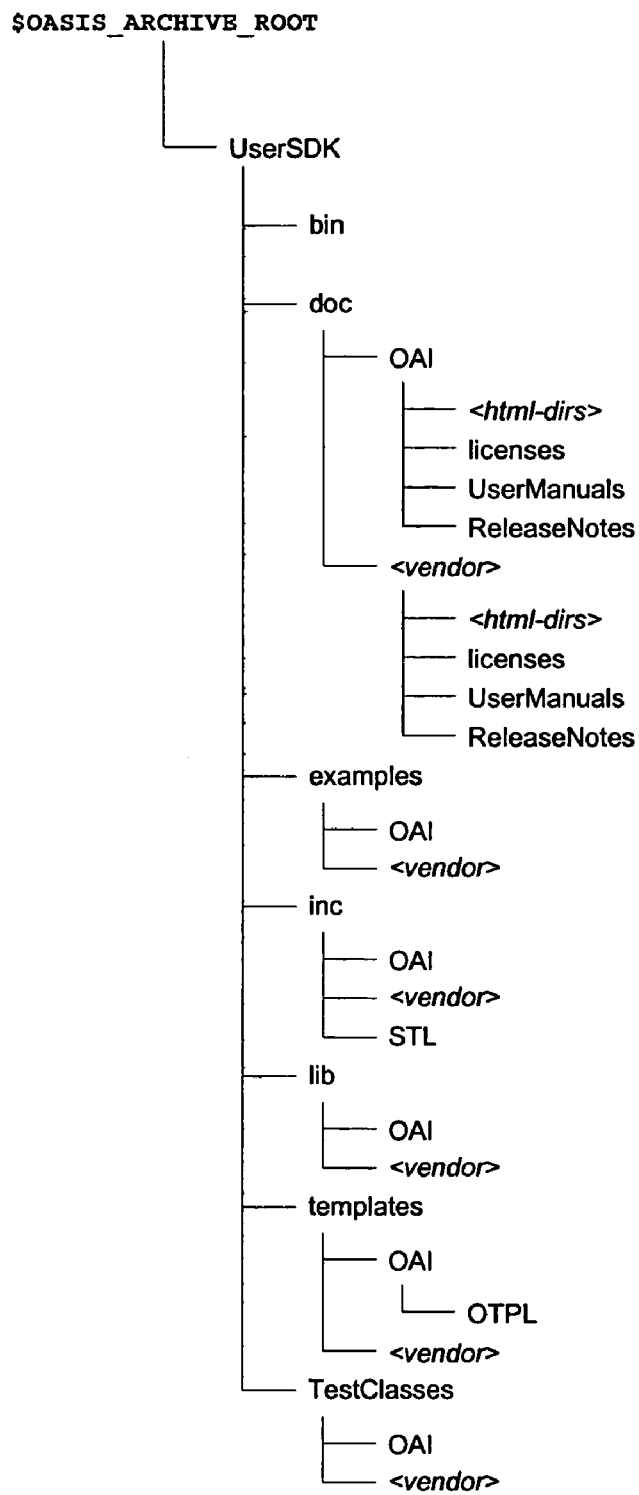
FIG. 4 illustrates a user SDK installation directory structure according to an embodiment of the present invention.
Figure 5:
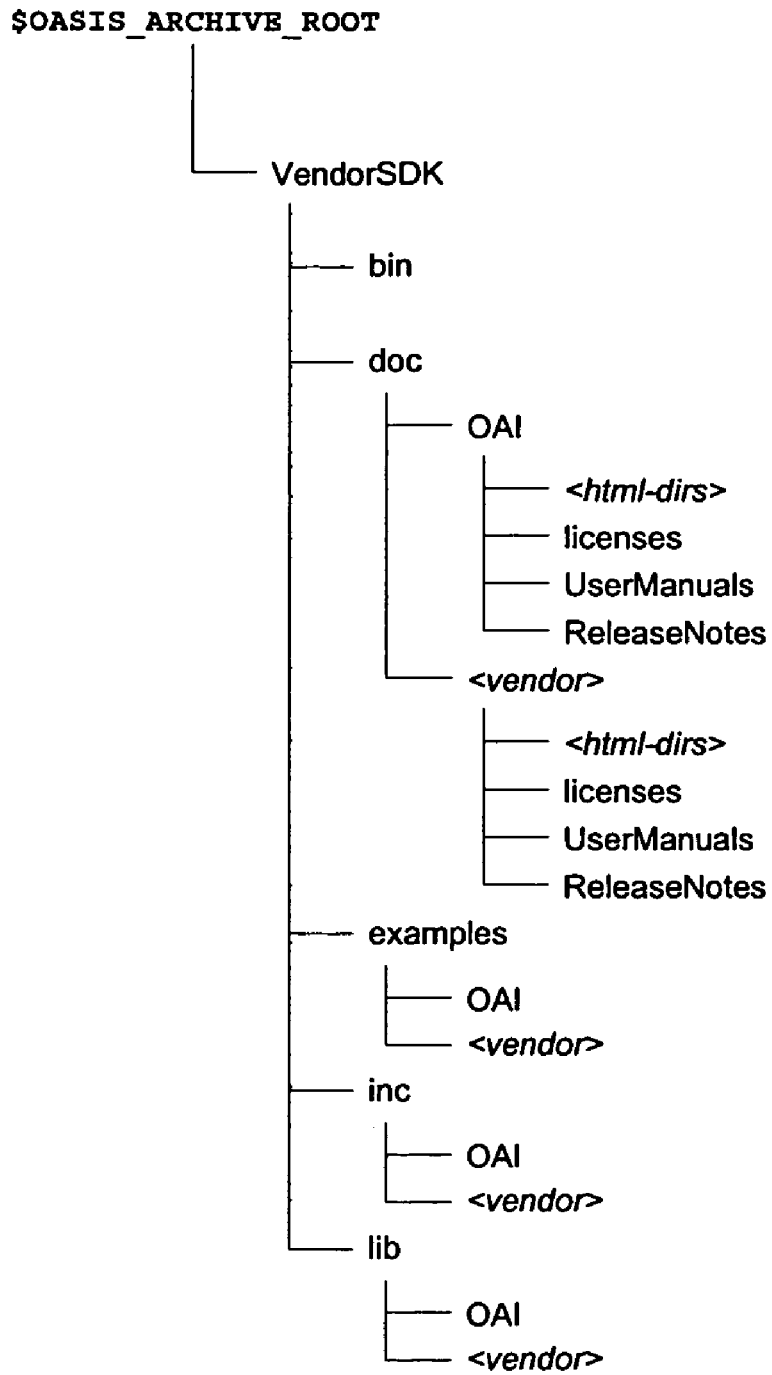
FIG. 5 illustrates a vendor SDK installation directory structure according to an embodiment of the present invention.

Note that in all cases, the names of files are legal on all supported platforms (Windows, Linux, etc.). Some examples are as follows:

AT_PinModule_10.01.008.dll
AT_PinModule_10.01.008_D.dll
AT_HCPowerSupplyModule_09.45.003.dll
OAI_utils_00.03.000.dll Installation Directory Structure The directory structure rooted at OASIS_ARCHIVE_ROOT is as shown in FIG. 3, FIG. 4 and FIG. 5, and further described in Table 2. In the discussion to follow, a software development kit is often referred to by its abbreviation "SDK". Also, the notation "$foo" refers to the value of an operating system environment variable foo. The installation process conforms to the following:

All open architecture test system software component files are installed in the appropriate locations under $OASIS_ARCHIVE_ROOT as shown in FIG. 3, FIG. 4 and FIG. 5, and described in Table 2.

The installation (i.e., archive) location is accessible from the tester system on which one wishes to activate the TOS.

In FIG. 3, FIG. 4, and FIG. 5, directories named OAI contain open architecture test system's TOS files, while directories named <vendor> contain vendor-specific files. Each vendor has its own directory, with <vendor> denoting a unique two to three letter identifier (e.g.: the Advantest vendor directory is labeled AT). Note that within each vendor-specific directory, the vendors are responsible for making sure that their filenames are unique. Also note that the requirement of explicit version identifiers in filenames allows different versions of the same component to be stored in the same location.

Table 2 further describes the directory structure outlined in the above figures, where each directory in the first column is relative to $OASIS_ARCHIVE_ROOT.

TABLE 2

Open Architecture Test System Installation Directory Structure

| Directory | Description |
| --- | --- |
| ./bin | Contains subdirectories OAI, <vendor> and sys for storing executables (DLLs and EXEs). The sys subdirectory contains system-specific or third party DLLs that are needed by the TOS, such as msvcrt70.dll, mfc70.dll, etc. |
| ./CDB | May contain (if the user so wishes) the open architecture test system Component Database, which maintains the relationships between all the CCRs that are present in the archive. |
| ./cfg | Contains configuration files used by system TOS or vendor components, or system and vendor tools, the latter being organized into tools-specific (<tool>) subdirectories. The common subdirectory is meant for use by vendors to place configuration information that needs to be shared across the TOS and more than one vendor's components. |
| ./doc | Contains documentation, separated into directories by category of documents. |
| ./InstallCCR | Location where original CCRs are saved at file installation time. |
| ./logs | Location where installers log their operation when loading files into the archive. |
| ./profiles | Location for storing profiles. The content of each profile is stored in a separate, named directory (represented by <profileX>). |

TABLE 2-continued

Open Architecture Test System Installation Directory Structure

| Directory | Description |
| --- | --- |
| ./{User,Vendor}SDK/bin | Contains SDK executables, such as tools, utilities, auxiliary applications, etc. |
| ./{User,Vendor}SDK/doc | Contains SDK documentation, separated into directories by category of documents. The base directory contains an index.html file that serves as the top-level index for all HTML-based documentation under the base directory, organized by topic in the <html-dirs>. |
| ./{User,Vendor}SDK/examples | Location for storing SDK examples. |
| ./{User,Vendor}SDK/inc | Location for storing include files. |
| ./UserSDK/inc/STL | Location for storing the C++ Standard Template Library (STL) files hierarchy. |
| ./{User,Vendor}SDK/lib | Location for storing library files. |
| ./UserSDK/templates | Location for storing template files needed by the user SDK. The OAI/OTPL subdirectory is used for storing the templates that the open architecture test programming language (OTPL) compiler, occ, uses for its operation. |
| ./UserSDK/TestClasses | Location for storing open architecture test system's test classes. |

Installation Logs

The directory logs contain the subdirectory Installer. This location supports the following specification:

Installers for open architecture test system software create an installation log at a well-known location, namely, $OASIS_ARCHIVE_ROOT/logs/Installer.

The naming convention used for the TOS installation log file is OAI_<version>.log. Vendor installers use the naming convention <vendor>_<version>.log. Two further requirements are as follows:

The installation log is a text file that explicitly shows the fully qualified path of each and every file copied to the archive.

If an installer is run multiple times to add or remove components, the installation log is updated to show the current status of files copied to or removed from the archive.

New Component Version Installation

When a new version of a component is released, the component supplier (TOS or vendor) provides a CCR for the new component version. The filenames of the component constituents reflect the new version of the component, as described in the file naming requirements section; following the file-naming rules prevents the overwriting of existing files. Thus, component file versions continue to accumulate in the archive directories.

Note that an installation package (as denoted by one of the release group CCRs described in below, or any vendor-provided release CCR for a direct vendor release) may contain individual components meant to fix or enhance a currently released version of a component. Since new versions of existing components do not replace existing components/files, any pre-existing system profiles may still run. Note the following requirement for a patch for a component:

When a new patch is made available (as signified by a change in the patch component of the major.minor.patch triplet version identifier), it is compatible with the major/minor version of the TOS release.

The detailed mechanism for such a "patch" is provided in below after release group CCRs and the user's system profile have been described.

Configuration

Configuration refers to the act of allowing the user to interact with the ICM system to create, save and modify the open architecture test system software configuration as system profiles, which are later used for activation of particular configurations on a specific tester system. This section describes the mechanisms provided by the ICM to perform this function.

Components and Configuration Records

In an open architecture test system, a component is one or more files, environment settings, and etc. that represent a distinct module in the system. An important category of system components are software representations of system hardware modules, which are regarded as primary components. Another category of components, for example, is an interface definition file for a SDK.

Single Component CCRs

As discussed above, each open architecture test system software component file installed in the archive is accompanied by a Component Configuration Record (CCR), which specifies the properties of the file. Thus, the TOS or vendor files that are under configuration control are associated with CCRs when they are installed into the archive. A CCR is a description of a file installed in the archive, containing information about that file, its version number, its associated component, its dependencies, its incompatibilities, etc. The CCR serves as input to the OCTool; which allows the user to view, control, track, and manage all of the components installed in the test system. The naming requirements for a CCR are identical to those for the corresponding system file it describes, except that a mandatory additional extension of .ccr is required. Thus, the CCR for the file AT_PinModule_0.5.1.dll is named AT_PinModule_0.5.1.dll.ccr. Note that installed CCRs are kept intact as the original reference of installation, in <OASIS_ARCHIVE_ROOT>/InstallCCRs. The CCR files are placed in the same directory location as the component files (component files are stored relative to archive directory), but relative to InstallCCR directory.

Group CCRs

CCRs can be represented as groups that reference more than one CCR—in fact, this is the principal method by which CCRs are often introduced into the system, since they naturally map to product release packages. The user can also choose an entire CCR group for inclusion in a profile, if necessary.

There are some important required group-CCRs for an open architecture test system installation. Besides the CCRs for each installed open architecture test system software component file, the following release group CCRs are required:

The open architecture test system's TOS release CCR, provided by the TOS supplier/system integrator;

The open architecture test system's UserSDK release CCR, provided by the system integrator or UserSDK supplier;

The open architecture test system's VendorSDK release CCR, provided by the system integrator or VendorSDK supplier.

The Group CCR's Uses the Following Group/File Naming Format:

VendorID_GroupType[_UserGivenName]_VersionIdentifier.gccr.

UserGivenName is optional.

The TOS Release CCR, named OAI_TOS_<version>.gccr, is a group CCR describing the contents of an overall release of the open architecture test system TOS runtime, nominally labeled as the "<version>" release. Note that <version> is the VersionIdentifier, as defined in above. It contains references to all the individual component CCRs that collectively define the "<version>" release of the open architecture test system TOS runtime. The type of this CCR is "TOS".

Similarly, the UserSDK and VendorSDK Release CCRs—OAI_USER_SDK_<version>.ccr and OAI_VENDOR_SDK_<version>.gccr respectively—are group CCRs describing the contents of overall releases of the open architecture test system user and vendor SDKs, and are of types "USER_SDK" and "VENDOR_SDK" respectively.

In addition to the above required group CCRs, hardware module vendors may choose to provide group CCRs to control the release of related components. These group CCRs are of the type "VENDOR", "USER", and "TOOLS".

Information in a Single Component CCR

As mentioned earlier, a primary component in the open architecture test system is the software representation of hardware modules. The information content of a CCR is oriented towards specifying all the attributes necessary to support such primary components, which are the most complex of all component categories. Such attributes are often not necessary for other, simpler categories of components, for which the values of such attributes need not be defined.

The information contained in a CCR is as shown in Table 3. For CCRs supporting open architecture test system primary components, it is the hardware module vendor's responsibility to provide this information.

TABLE 3

Information Content of a Single Component CCR

| CCR Field | Description | Required |
|---|---|---|
| Description | A string providing a brief description of this component. | No |
| VendorName | A string providing a name for the vendor of this component. | Yes |
| VendorID | The open architecture test system's vendor identifier for this component. The ID matches the set of identifiers recognized by the open architecture test system's test environment files. | Yes |
| ModuleName | A string providing the name of the open architecture test system's hardware module (if any) that is associated with this component. | No |
| ModuleID | The open architecture test system's hardware module identifier (if any) that is associated with this component. The ID matches the set of identifiers recognized by the open architecture test system's test environment files. | No |
| FileParams | Parameters (if any) to pass to the file this is a CCR for, if the file is an executable (such as an EXE or a DLL), when that file is loaded by the system. | No |
| Function | A list of one or more of the following: Driver, Calibration, Diagnostic, Emulator, GPIB, RS232 or PatternCompiler. This indicates the primary function(s) of this file, if it is an executable associated with software control of a hardware module. The Calibration function is also required to provide a parameter that names the path to the calibration program algorithm versions information file associated with this particular Calibration DLL. | No |
| Resource | List of open architecture test system resources, if any, together with their unit count, that the file (for which this is a CCR) controls. Thus, this field is valid for CCRs for files with Driver or Emulator functionality. | No |
| HardwareRev | List of hardware component versions (i.e., board versions) that a Driver, Calibration, Diagnostic, Emulator or PatternCompiler file is designated to work with. | No |
| DeployTo | One of "SYSC", "SITEC" or "BOTH", indicating where the file for which this is a CCR should be copied to during activation (which is not necessarily where it may end up at runtime). | Yes |
| Register | One of "Debug", "Release", or "BOTH", indicating whether registration of file attributes with the Windows system registry is necessary or not. This field applies to CCRs for executables; the standard registration mechanism assumed (in the non-"NO" cases) is the use of regsvr32 with DLLs that provides a DLLRegister( ) method, while EXEs provides "/register" and "/unregister" command line options. | No |
| GroupDependency | List of dependent release group CCRs names. Valid format is VendorID_GroupType[_UserGivenName]_<Version>. | No |
| CompDependency | List of dependent component names. Valid format is VendorID_ComponentName_<Version>[.ext] | No |

TABLE 3-continued

Information Content of a Single Component CCR

| CCR Field | Description | Required |
|---|---|---|
| GroupIncompat | List of incompatible release group CCRs. Valid format is VendorID_GroupType[_UserGivenName]([<, <=, >, >=] <Version>) | No |
| CompIncompat | List of incompatible component CCRs. Valid format is VendorID_ComponentName[.ext] ([<, <=, >, >=] <Version>) | No |
| CompType | One of "Doc", "Src" or "Bin" indicating what type the component corresponds to. "Doc" corresponds to documentation type. "Src" corresponds to source type. "Bin" corresponds to binary type. | No |

An example of a simple single-component CCR file, for the Driver DLL for a vendor digital pin module, is given below:

```
Version 1.0;
Description        "Advantest Digital Pin Module Driver";
VendorName         AT;
VendorID           1;
ModuleName         DM250 MHz;
ModuleID           4;
FileParams         " ";
Function           Driver;
Resource           "moduletrigger{MaxAvailable = 4;}",
                   "dpin{MaxAvailable = 32;}";
HardwareRev        1095188784;
DeployTo           SYSC;
Register           "N";
GroupDependency    AT_VENDOR_Modules_1.0.1.0,
                   AT_Tools_GemTools_1.0.1.0;
GroupIncompat      OAI_TOS(<0.5.0);
CompIncompat       AT_PinModule.dll(<0.5.0);
CompType           Bin;
```

Next is an example of the single-component CCR file for the calibration DLL for the same vendor digital pin module:

```
Version 1.0;
Description        "Advantest Digital Pin Module Calibration
                   DLL";
VendorName         AT;
VendorID           1;
ModuleName         DM250 MHz;
ModuleID           4;
FileParams         "";
Function           Calibration
                   [cfg/AT/AT_Cal_DM250MHz_0.5.021.algver.ini];
HardwareRev        1095188784;
DeployTo           SYSC;
Register           N;
GroupIncompat      OAI_TOS(<0.5.0);
```

Note that Version specifies the version of the CCR description language, and is not necessarily related to the version(s) of any component it describes. The Resource field in the first example above indicates that this module Driver (for the DM250 MHz hardware module) is capable of driving a hardware module that provides 4 units of the moduletrigger resource, and 32 units of the dpin resource. The parameter "cfg/AT/AT_Cal_DM250 MHz_0.5.021.algver.ini" (for the Function designated as Calibration in the second example) specifies the pathname of the file containing calibration program algorithm version information. This is used—after an import into the Configuration Database (CDB), by the OCTool to generate Calibration bundle information. The value of "OAI_TOS(<0.5.0)" for the GroupIncompat field in each example indicates that the DLL that CCR describes is incompatible with open architecture test system's TOS components included in TOS release group CCRs with version numbers lower than 0.5.0.

Information in a Group CCR

A group CCR is a CCR that describes a collection of individual component, or other group CCRs. The information contained in a group CCR is shown in Table 4.

TABLE 4

Information Content of a Group CCR

| CCR Field | Description | Required |
|---|---|---|
| Description | A string providing a brief description of the group of components represented by this CCR. | Yes |
| VendorName | A string providing a name for the vendor of this Group. | Yes |
| VendorID | The open architecture test system's vendor identifier for this Group. The ID matches the set of identifiers recognized by the open architecture test system's test environment files. | Yes |
| OAIMCFVersion | The version(s) of the file specification language for the open architecture test system module configuration file (MCF) that this collection of components is compatible with, which is required for the TOS release CCR. | No |
| OAISimVersion | The version(s) of the file specification language for the open architecture test system simulation configuration file (SCF) that this collection of components is compatible with, which is required for the TOS release CCR. | No |
| OAIOCFVersion | The version(s) of the file specification language for the open architecture test system offline configuration file (OCF) that this collection of component is compatible with, which is required for the TOS release CCR. | No |
| Component | List of individual component CCRs that constitute this group. | Yes |

The following is an example of a group CCR for an open architecture test system's TOS release:

```
Version 1.0;
ComponentGroup OAI_TOS_1.1.0.029
{
    Description         "Open architecture test system TOS
    Release Package";
    VendorName          AT;
    VendorId            1;
    OAIMCFVersion       ">= 1.0";
    OAISimVersion       ">= 0.9.5";
    OAIOCFVersion       ">= 1.0.1";
    Component
    {
        bin/OAI/OAI_Core_0.4.9.dll.ccr;
        bin/OAI/OAI_StdProxy_0.3.7.dll.ccr;
        ...
    }
}
```

Importing group CCRs

In addition to describing groups, group CCRs can import other group CCRs. The following is an example to import group CCRs.

```
Version 1.0;
Import OAI_USERSDK_1.0.0.1;
ComponentGroup OAI_TOS_1.1.0.029
{
    Description         "Open architecture test system's TOS
    Release Package";
    VendorName          AT;
    VendorId            1;
    OAIMCFVersion       ">= 1.0";
    OAISimVersion       ">= 0.9.5";
    OAIOCFVersion       ">= 1.0.1";
    Component
    {
        bin/OAI/OAI_Core_0.4.9.dll.ccr;
        bin/OAI/OAI_StdProxy_0.3.7.dll.ccr;
        ...
    }
}
```

Configuration Database

The ICM Configuration Database (CDB) maintains the collection of system configuration data represented through all installed CCRs. The CDB also maintains user-created system profile information. The information managed in the CDB is independent of any particular tester installation.

Creation of the CDB and importing CCR data into it is handled by the open architecture test system's CDBMgr tool. The CDBMgr tool need not be installed or run on the tester, and the information it manipulates is not specific to a particular tester. However, it needs access to the directory tree rooted at $OASIS_ARCHIVE_ROOT, since it needs to read CCR files stored within that tree (the import function).

The information in the CDB is used to create system profiles, which are also stored in the CDB, and which are described next.

System Profiles

The following requirement specifies a system profile:

An open architecture test system's system profile, chosen by the user, is the total collection of information necessary to define a particular open architecture test system software configuration that is required to work on an open architecture test system.

A system profile does not contain information specific to any particular tester; rather, it encapsulates all necessary information and inter-dependencies amongst the following set of software components chosen by the user for activation on a tester.

hardware module-related software (such as driver, emulation, calibration and diagnostics components), open architecture test system runtime software, user SDK components (needed for a test development environment), and vendor SDK components (needed for a module development environment)

Note that while user-created system profile information is stored in the CDB, the act of exporting a system profile (through the OCTool) causes a file to be created that contains all pertinent tester-independent information that defines the profile, thereby making the profile available external to the CDB. This can then be used by the open architecture test system's activation process. The file in which the profile information is stored is named OASISVer.cfg, which is in standard windows INI file format, and which is stored in the corresponding $OASIS_ARCHIVE_ROOT/profiles/<profile_dir> directory by default. However, while exporting the profile, the user can choose to place the file in any location of his choice.

During activation, the tester-independent information stored in a user profile is combined with tester-specific information to form the tester's active configuration, which comprises a set of test environment files stored in $OASIS_ACTIVE_CONFIGS. Activation is described in the following section, where the system profiles are revisited.

OCTool

Once the open architecture test system's CDB has been populated with CCR data, the Configuration Tool (OCTool) is used to create, save, modify and export (i.e., make available external to the CDB) system profiles created by the user.

The OCTool need not be installed or run on the tester, and the information it manipulates is not specific to a particular tester. However, it needs access to the directory tree rooted at $OASIS_ARCHIVE_ROOT, since it needs to save user profile information to $OASIS_ARCHIVE_ROOT/profiles/<profile_dir> (the export function).

Activation

The following requirement specifies open architecture test system's software system activation. Activation of an open architecture test system's software system is the act of 1. using the tester-independent configuration information in a chosen system profile,
2. combining it with tester-specific information to create tester active configuration information in $OASIS_ACTIVE_CONFIGS,
3. deploying (i.e., placing and registering) all required software components (files) under $OASIS_INSTALLATION_ROOT,
4. and starting the open architecture test system's TOS with the chosen configuration on the target tester.

Activation of an open architecture test system's software system is a function of the open architecture test system's tester control daemon (TCD). As described above, the TCD provides COM interface methods that allow a connected application to send tester control commands. Recall that the TCD controller application installed in <MAINTENANCE_ROOT>/bin is a simple command-line application that can send the basic tester system control commands, such as "start", "stop", "activate", etc. to the TCD. Also recall that this is the t2kctrl application in the Advantest T2000 system. In this section, the use of the t2kctrl application to perform the "activate" function described.

Prerequisites

Before attempting to activate a particular open architecture test system configuration (through a chosen profile), the following prerequisites have to be satisfied:

1. The location specified by $OASIS_ARCHIVE_ROOT is accessible to the TCD running on the target tester machine's System Controller.
2. A previously-defined open architecture test system's system profile has been exported into OASISVer.cfg, and is available at either $OASIS_ARCHIVE_ROOT/profiles/<profile_dir>, or another location/ of the user's choice, and the exported file OASISVer.cfg is accessible to the TCD running on the target tester machine's System Controller.
3. The environment variables OASIS_INSTALLATION_ROOT and OASIS_TEMP have been defined. Note that if another configuration of open architecture test system's system software is already available at the location pointed to by $OASIS_INSTALLATION_ROOT, that installation is backed up to ${OASIS_INSTALLATION_ROOT}_BAK, and the activation process, if successful, places the chosen new configuration under $OASIS_INSTALLATION_ROOT.
4. The environment variable OASIS_ACTIVE_CONFIGS has been defined. Note that if this directory already exists, and another set of active configuration information for open architecture test system's system software is already available at that location, that installation is backed up to ${OASIS_ACTIVE_CONFIGS}_BAK, and the activation process, if successful, creates the test environment files corresponding to the chosen new active configuration under $OASIS_ACTIVE_CONFIGS.
5. The environment variable OASIS_MACHINE_DIR has been defined*. Note that if this directory already exists, the directory $OASIS_MACHINE_DIR/CD/bundles is purged of any existing calibration/diagnostic (CD) bundle description files, and the CD bundle description file(s) associated with the chosen profile is instated at that location.
6. The tester factory defaults (FDEF) file, <MAINTENANCE_ROOT>/cfg/OASISHW.def, exists on the System Controller. This file is essential for providing tester-specific information to the activation process.
7. The open architecture test system is in State n, n>0, i.e., at least the TCD on the System Controller of the target machine is running. If it is not, one should start it by issuing the command "net start T2000Svc".

Using the t2kctrl Application

The following command may be used to invoke the activation process from the System Controller of the target machine:

t2kctrl switch <config> <archive-location> <profile-directory-name> where

| | |
|---|---|
| <config> | Should be one of DEBUG or RELEASE, indicating the build mode of the software that should be instated. |
| <archive-location> | Should specify the full pathname of the location pointed to by the environment variable OASIS_ARCHIVE_ROOT. |
| <profile-directory-name> | Should specify the full pathname of the profile directory in which the exported profile information is located. |

Activation Process

The process of activation, once the appropriate command has been issued, is as follows:

1. If the tester is in a State>2 (see pg 10), the System Controller TCD first issues a TOS "shutdown" command that ultimately brings the system to State 1. If any open architecture test system application is connected to the System Controller at this time, it is sent a message asking it to disconnect, and allowed sufficient time to clean up its state and exit gracefully, or forcibly terminated otherwise. Note that this does not apply to applications that are not connected to the System Controller at that time.
2. Once the system is at State 1, the current installation at $OASIS_INSTALLATION_ROOT, if any, is backed up to ${OASIS_INSTALLATION_ROOT}_BAK, and all open architecture test system executables that had been registered with the Windows registry (see the "Register" field in Table 3) are de-registered. This is done for the System Controller, as well as all Site Controllers.
3. The current active configuration information in $OASIS_ACTIVE_CONFIGS, if any, is then backed up to ${OASIS_ACTIVE_CONFIGS}_BAK, and the CD bundle description file(s) in $OASIS_MACHINE_DIR/CD/bundles (if any) are deleted.
4. After the backups (if necessary) of the current installation and active configuration information have successfully completed, the TCD copies the archived open architecture test system's software system files, as specified by the chosen (new) profile, over to the locations specified in the next section. In a distributed environment (separate System and Site controller(s)), the files required to be installed on the Site Controllers are also copied over to those machines.
5. The TCD then registers all open architecture test system executables that are required to be registered with the Windows registry, on both System and Site Controller(s).
6. The tester-independent information from the chosen (new) profile is then combined with the tester-specific information from the tester factory defaults file (located in the <MAINTENANCE_ROOT>/cfg directory on the System Controller) by the TCD. This results in the creation of the following set of files that define the active configuration for the new open architecture test system software runtime installation on the target tester machine:
   i. The Module Configuration File, OASISModules.cfg.
   ii. The Simulation Configuration File, OASISSim.cfg.
   iii. The System Configuration File, OASISSys.cfg.
   iv. The Offline Configuration File, OASISOffline.cfg.
   These files are placed by the TCD in $OASIS_ACTIVE_CONFIGS.
7. The TCD also places a copy of the new profile information file, OASISVer.cfg, in the $OASIS_ACTIVE_CONFIGS location, to serve as a record of the contents and configuration of the system as per the new profile.
8. Finally, the TCD follows the TOS "startup" sequence outlined in steps 2-4 of the TOS startup process to start the TOS in the new configuration, thus completing the activation process.

Note that failure to perform any of the above steps successfully causes the open architecture test system installation to revert to the configuration it is in before the activation command is issued, and the TCD to re-start the TOS in that configuration. In addition, a detailed log of the entire process is maintained at the location $OASIS_INSTALLATION_

ROOT/logs/Deployment. The log is named Deployment.log and is overwritten with each new invocation of the TCD's "activate" command.

Deployment Directory Structure

As mentioned earlier, the TCD copies the required open architecture test system's software files from their archived location under $OASIS_ARCHIVE_ROOT to the deployment or runtime installation on the target tester, at $OASIS_INSTALLATION_ROOT.

Figure 6:
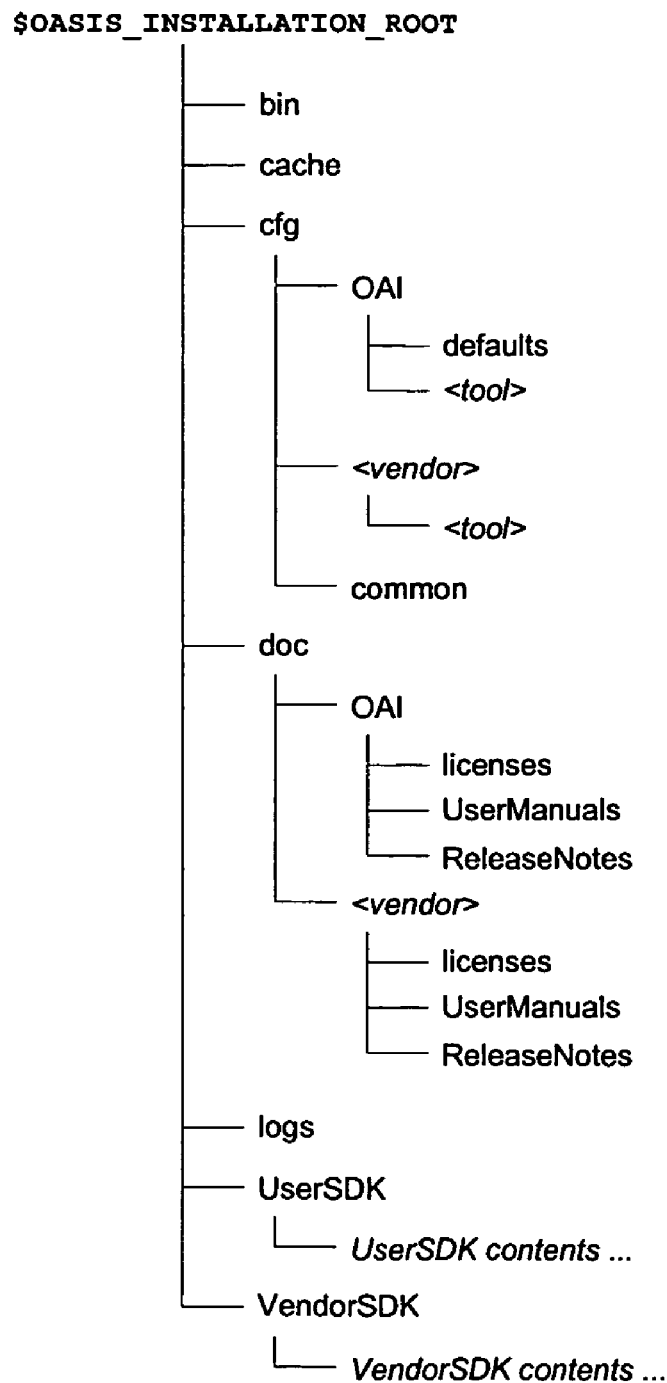
FIG. 6 illustrates a TOS deployment directory structure according to an embodiment of the present invention.
Figure 7:
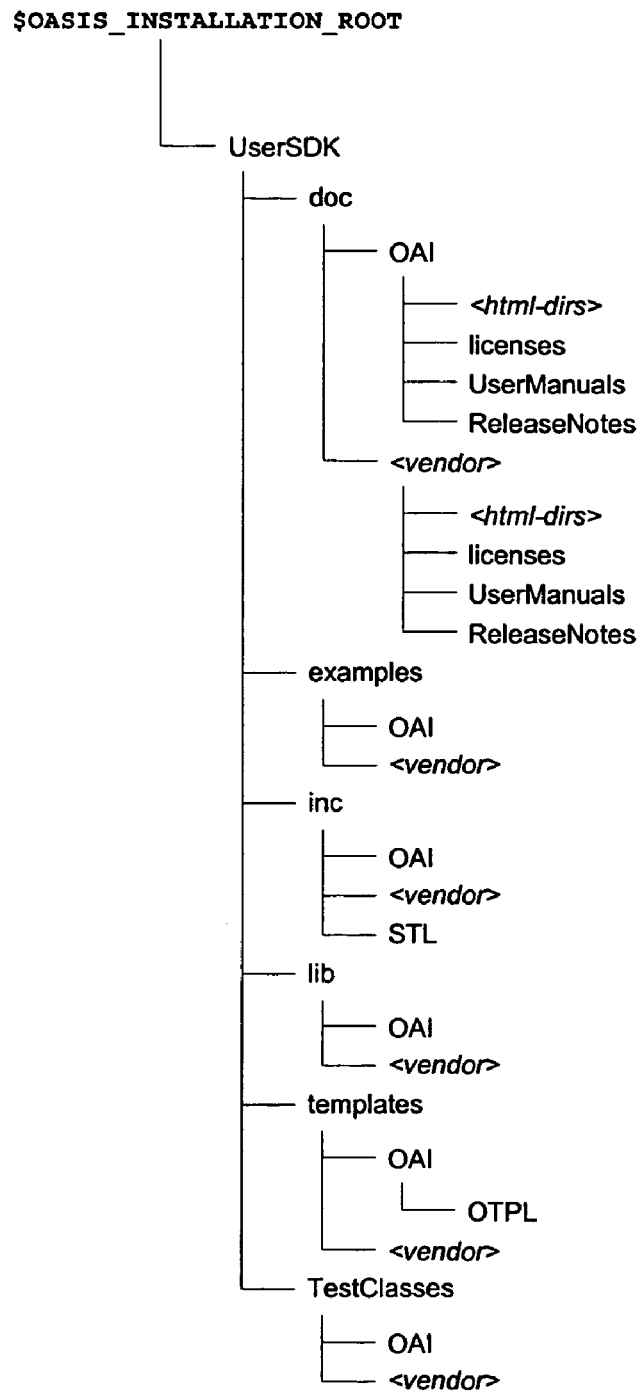
FIG. 7 illustrates a user SDK deployment directory structure according to an embodiment of the present invention.
Figure 8:
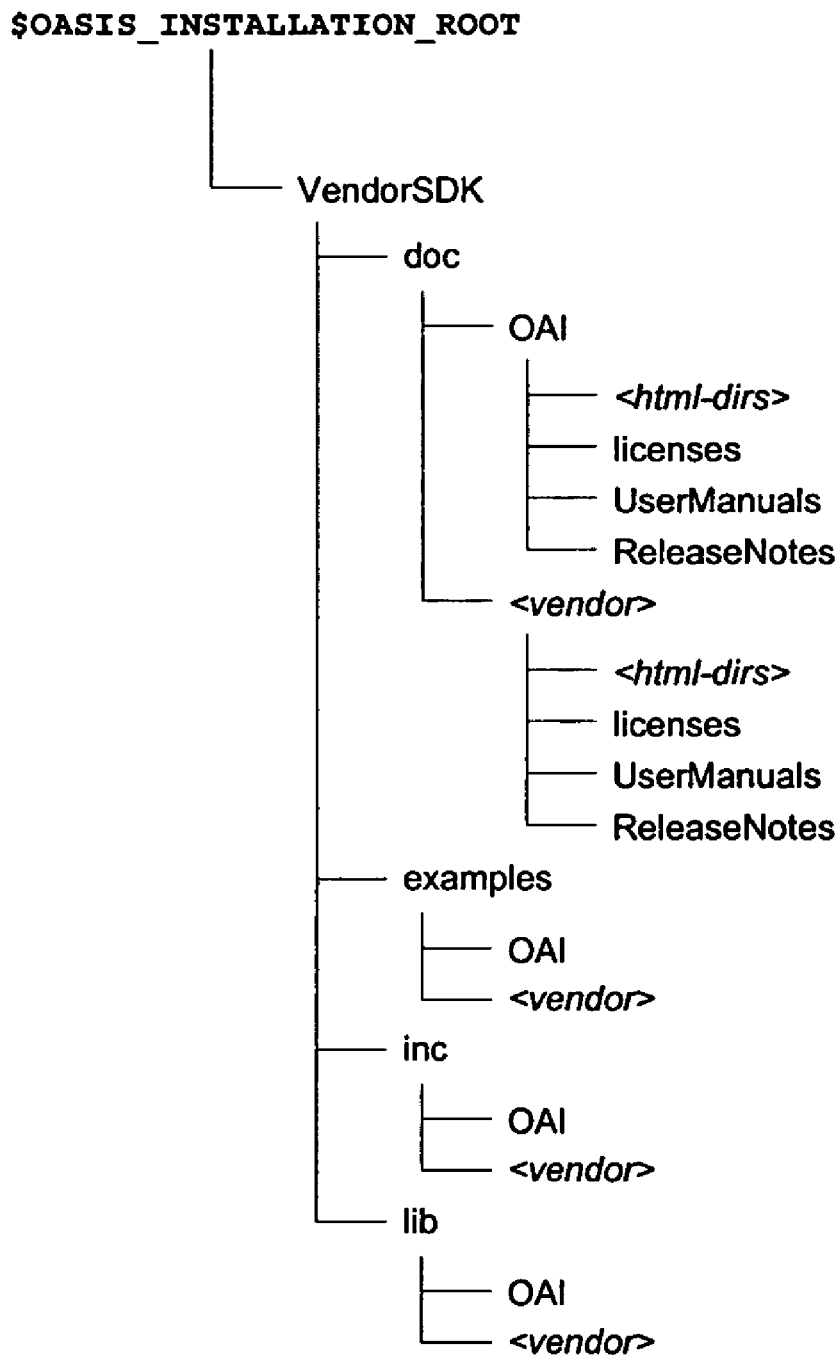
FIG. 8 illustrates a vendor SDK deployment directory structure according to an embodiment of the present invention.

The directory structure for the open architecture test system deployment on a tester, rooted at $OASIS_INSTALLATION_ROOT, is as shown in FIG. 6, FIG. 7, and FIG. 8. The activation process conforms to the following:

All open architecture test system software component files are deployed, for activation of the runtime on the tester machine, in the appropriate locations under $OASIS_INSTALLATION_ROOT as shown in FIG. 6, FIG. 7, and FIG. 8, and described in Table 5.

In the following figures, directories named OAI contain open architecture test system's TOS files, while directories named <vendor> contain vendor-specific files. As in the archive structure, each vendor has its own directory, with <vendor> denoting a unique two to three letter identifier (e.g.: the Advantest vendor directory is labeled AT).

Table 5 further describes the directory structure outlined in the above figures, where each directory in the first column is relative to $OASIS_INSTALLATION_ROOT.

TABLE 5

Open Architecture Test System Deployment Directory Structure

| Directory | Description |
| --- | --- |
| ./bin | Contains all executables (DLLs and EXEs) used by the runtime. Note that there are no subdirectories under this: all files are placed at the same level. This facilitates the need for minimal manipulations of the user's system PATH environment variable at system run time. Also note that all executables originally archived under $OASIS_ARCHIVE_ROOT/{Vendor,User}SDK/b in are also deployed at this directory. |
| ./cache | Contains runtime caches of files needed by the TOS. |
| ./cfg | Contains configuration files used by system TOS or vendor components, or system and vendor tools, the latter being organized into tools-specific (<tool>) subdirectories. The common subdirectory is meant for use by vendors to place configuration information that needs to be shared across the TOS and more than one vendor's components. |
| ./doc | Contains documentation, separated into directories by category of documents. |
| ./logs | Location where installers log their operation when loading files into the archive. |
| ./{User,Vendor}SDK/doc | Contains SDK documentation, separated into directories by category of documents. The base directory contains an index.html file that serves as the top-level index for all HTML-based documentation under the base directory, organized by topic in the <html-dirs>. |
| ./{User,Vendor}SDK/examples | Location for storing SDK examples. |
| ./{User,Vendor}SDK/inc | Location for storing Include files. |
| ./UserSDK/inc/STL | Location for storing the C++ Standard Template Library (STL) files hierarchy. |
| ./{User,Vendor}SDK/lib | Location for storing library files. |
| ./UserSDK/templates | Location for storing template files needed by the user SDK. The OAI/OTPL subdirectory is used for storing the templates that the OTPL compiler, occ, uses for its operation. |

TABLE 5-continued

Open Architecture Test System Deployment Directory Structure

| Directory | Description |
| --- | --- |
| ./UserSDK/TestClasses | Location for storing open architecture test system's test classes. |

Filename Conversions

During activation, when files are deployed to the runtime environment from the archive, the TCD strips off the version identifier embedded in the filenames. Thus, for example, the file OAI_utils__0.1.2.dll in the archive is copied to the file OAI utils.dll in the runtime installation, while the file AT_Cal_DM250 MHz_D__1.2.3.dll in the archive is copied to the file AT_Cal_DM250 MHz_D.dll in the runtime installation.

Active Tester Configuration

As described in the activation process, during the deployment of open architecture test system on the target tester machine, the tester-independent information from the chosen (new) profile is merged with the tester-specific information from the FDEF file by the TCD. This results in the creation of the following set of files that define the active configuration for the new open architecture test system software runtime installation on the target tester machine:

The Module Configuration File, OASISModules.cfg.

The Simulation Configuration File, OASISSim.cfg.

The System Configuration File, OASISSys.cfg.

The Offline Configuration File, OASISOffline.cfg.

These files are placed by the TCD in $OASIS_ACTIVE_CONFIGS. Note that one should not set $OASIS_ACTIVE_CONFIGS to a location inside the directory tree rooted at $OASIS_INSTALLATION_ROOT.

Open Architecture Test System Machine Data

Tester machine-specific data, such as calibration/diagnostics (CD) data, etc., are stored on the System Controller, under the location pointed to by the environment variable OASIS_MACHINE_DIR. Besides data, the CDdata directory contains the sub-directory CD/bundles, which is used to store the CD bundle description file(s) associated with the currently deployed (i.e., active) profile.

Note that the data sets in the $OASIS_MACHINE_DIR location are maintained completely by the user, and it is the user's responsibility to make available the proper data sets as required by the particular machine. However, the activation process is responsible for the following action with regard to the CD bundle description file(s):

Any existing CD bundle description file(s) in $OASIS_MACHINE_DIR/CD/bundles are deleted. The CD bundle description file(s) for the new, chosen profile are then deployed to $OASIS_MACHINE_DIR/CD/bundles.

Note that one should not set $OASIS_MACHINE_DIR to a location inside the directory tree rooted at $OASIS_INSTALLATION_ROOT.

Audit

A profile audit for the open architecture test system allows the user to verify the contents of given profile stored in the CDB. An open architecture test system audit, on the other hand, refers to the act of providing a listing of currently active software and hardware components on a particular test system. The following facilities are available to allow this activity.

Profile Audit

This is available, for the tester-independent profile information, through two different mechanisms:

The OCTool application can display the contents of a chosen profile that has been stored in the CDB.

The act of exporting a given profile (which is performed before an activation of that profile can be accomplished) to the default location $OASIS_ARCHIVE_ROOT/profiles/<profile_dir> (or another location of the user's choice) creates the file OASISVer.cfg. The contents of the file completely describe the chosen profile. Since the file is in plain-text and in standard Windows INI file format, the information can be scanned to provide the desired audit functionality. Note that in an active deployment, this file is also made available at $OASIS_ACTIVE_CONFIGS.

System Audit

The system audit can be divided into two parts: deployed software audit, and tester hardware audit.

Deployed Software Audit

The deployed software audit is facilitated through the following requirement that is satisfied on an open architecture test system:

The process of open architecture test system's software deployment or activation on a target tester machine creates a plain-text deployment log that provides complete details of the software components deployed. This log is to be named Deployment.log, and made available on the System Controller at the location <MAINTENANCE_ROOT>/logs/Deployment.

Since the log file is in plain-text, the information in it can be scanned to provide the required audit functionality.

Tester Hardware Audit

The tester hardware audit is facilitated through the following requirement that is satisfied by the TOS on an open architecture test system:

Module detail information is written in the open architecture test system Hardware Inventory (HWINV) file format each time the TOS is started. This is stored in the file OASISHW.inv, made available on the System Controller at the location <MAINTENANCE_ROOT>/cfg.

Since the hardware inventory file is in plain-text, the information in it can be scanned to provide the required audit functionality.

Software Patch Releases

As described in the new component version installation section above, an installation package may contain individual components meant to fix or enhance a currently released version of a component. When such an installation package is compatible with the major/minor version of the release it is meant to fix, the package (and, by extension, the release it pertains to) is referred to as a "patch". In this section, the steps performed in providing such a patch release is described.

When a new version of a component is released, the component supplier (TOS or vendor) provides a CCR for the new component version. The filenames of the component constituents reflect the new version of the component, as described in the file naming requirements section; following the file-naming rules prevents the overwriting of existing files. Thus, component file versions continue to accumulate in the archive directories. Since new versions of existing components do not replace existing components/files, any pre-existing system profiles may still run.

Providing a Patch Release

The steps for providing a patch release are as follows:
1. The provider (TOS supplier, vendor or system integrator) identifies and creates the (set of) component(s) that are meant to fix or enhance a current release. As an example, consider a TOS patch comprising updated versions of the OAI_core.dll and the OAI_messages.dll, where the currently released versions are OAI_core_1.2.9.dll and OAI_messages_1.2.2.dll. Let the TOS Release CCR for the current release be OAI_TOS_1.2.11.ccr.
2. Each component in the above set is assigned a name with an update of the "patch" field in the major.minor.patch triad that identifies the versioned component in the system. Thus, the updated components in our example above may be named OAI_core_1.2.10.dll and OAI_messages_1.2.3.dll.
3. A new patch CCR is created for each of the updated components, reflecting the updated version information. Thus, the updated CCRs for the components in our example above may be OAI_core_1.2.10.dll.ccr and OAI_messages_1.2.3.dll.ccr.
4. A new release group CCR is created to replace the original group CCR that is being used for the current release. This CCR contains updated references for the set of new CCR(s) for the updated components (in our example, OAI_core_1.2.10.dll.ccr and OAI_messages_1.2.3.dll.ccr), while the references to all other components in the group stay the same as those for the current release. This new group CCR is also given a <version> number that has an update for the "patch" field in the major.minor.patch triad that nominally identifies the collective "<version>" release of the package being considered. Thus, in our example, this new release group CCR may be named OAI_TOS_1.2.11.ccr.
5. The supplier creates an open architecture test system's archive installation package consisting of the updated components, their updated individual CCRs, and the new release group CCR for the overall package. This package is delivered as an integrated "patch" for the identified components.

Using a Patch Release

At the user's end, the procedure for installing, configuring, and activating the patch is as follows:
1. The user installs the contents of the patch package into the open architecture test system installation archive location.
2. The user configures for the patch by first recalling the profile he intends to use, and modifying it (or using it as the basis for a new profile) to use the new release group CCR (and thereby, the individual component CCRs for the updated components), and saving the resulting modified (or new) profile.
3. Finally, the user employs the above modified (or new) profile to activate the patch using the t2kctrl tool.

Hardware-Only Patches

Hardware suppliers occasionally need to update hardware versions without needing to update the corresponding software. In such a case existing CCRs for the software do not contain correct compatibility information for the new hardware versions.

A Hardware-Only Patch (HOP) refers to a release of updated CCRs whose purpose is to update hardware/software compatibility relationships. When these CCRs are imported into the database profiles may be updated with the new compatibility information. Such CCRs are created as usual and may be distributed as a package without any software. When users received these new CCRs, the procedures for installing, configuring, and activating the patch one used for handling the new CCRs.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally, and logically implemented in any suitable way. Indeed the functionality may be implemented in a single unit, in a plurality of units or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for managing multiple hardware test module versions, software components, and tester operating system (TOS) versions in a modular test system, wherein the modular test system comprises a system controller for controlling at least one site controller, and wherein the at least one site controller controls at least one hardware test module, comprising:
    installing the TOS versions compatible with the modular test system in an archive;
    installing vendor software components corresponding to the hardware test module versions in the archive;
    creating system profiles for describing vendor software components corresponding to the hardware test module versions and the TOS versions as tester independent information that does not contain information specific to a particular test system, each of the system profiles encapsulating inter-dependencies amongst the vendor software components;
    selecting a system profile which comprises a set of compatible vendor software components and a selected TOS for testing a particular hardware test module version for the test system;
    creating tester active configuration by combining the selected system profile with test-specific information; and
    activating the TOS on the system controller and the at least one site controller based on the created tester active configuration.

2. The method of claim 1, wherein installing vendor software components comprises:
    installing a test control daemon (TCD) for performing general control of the TOS versions; and
    installing TOS control directories.

3. The method of claim 2, wherein installing TOS control directories comprises:
    installing a bin directory for storing TCD controller applications and their associated dynamic link libraries;
    installing a configuration directory for storing configuration files relating to factory default settings of the tester;
    installing a documentation directory for storing TCD and factory default documentations; and
    installing an installation log directory for storing operations of the TCD.

4. The method of claim 3, wherein the installation log directory comprises:
    a path for each file copied to the archive; and
    a status of files copied to or removed from the archive.

5. The method of claim 1, wherein installing vendor software components further comprises:
    installing a single component configuration record (single CCR); and
    installing a group component configuration records (group CCR).

6. The method of claim 5, wherein the single CCR comprises:
    a vendor name of a software component; and
    a vendor identifier of the software component.

7. The method of claim 5, wherein the group CCR comprises:
    a description of the group of components represent by the group CCR;
    a vendor name of the group CCR; and
    a vendor identifier of the group CCR.

8. The method of claim 1, wherein the system profile comprises:
    software components specific to the hardware test module versions;
    user software development kits (user SDKs); and
    vendor software development kits (vendor SDKs).

9. The method of claim 8, wherein the software components specific to the hardware test module versions comprise:
    device drivers;
    emulation software components;
    calibration software components; and
    diagnostic software components.

10. The method of claim 1, wherein activating the selected TOS comprises:
    initializing the selected TOS; and
    deploying a chosen software configuration from the system profile of the modular test system.

11. The method of claim 10, wherein initializing the selected TOS comprises:
    initializing the system controller;
    initializing the site controller; and
    initializing user applications in accordance with the system profile for the modular test system.

12. The method of claim 10, deploying a chosen software configuration comprises:

combining tester-independent configuration information with test-specific information to create a tester active configuration information;

deploying software components from predefined directory locations; and starting the selected TOS with the chosen software configuration of the particular hardware test module version.

13. The method of claim 1 further comprising:

verifying compatibility of a new vendor software component version with existing TOS versions.

14. A modular test system for managing multiple hardware test module versions, software components, and tester operating system (TOS) versions, comprising:

a system controller for controlling at least one site controller;

at least one site controller for controlling at least one hardware test module;

an archive for storing test operating system versions compatible with the modular test system and vendor software components corresponding to the hardware test module versions;

means for creating and saving a system profile for describing vendor software components corresponding to the hardware test module versions and the TOS versions as tester-independent information that does not contain information specific to a particular test system, the system profile encapsulating inter-dependencies amongst the vendor software components; and means for selecting the system profile which comprises a set of compatible vendor software components and selected TOS for testing a particular hardware test module version, wherein the system controller and the at least one site controller create tester active configuration by combining the selected system profile with tester-specific information, and active the selected TOS based on tester active configuration created.

15. The system of claim 14, wherein the vendor software components comprise:

test control daemons (TCDs) for performing general control of the TOS versions; and TOS control directories.

16. The system of claim 15, wherein the TOS control directories comprise:

a bin directory for storing TCD controller applications and their associated dynamic link libraries;

a configuration directory for storing configuration files relating to factory default settings of the tester;

a documentation directory for storing TCD and factory default documentations; and an installation log directory for storing operations of the TCD.

17. The system of claim 16, wherein the installation log directory comprises:

a path for each file copied to an archive; and a status of files copied to or removed from the archive.

18. The system of claim 14, wherein the vendor software components further comprise:

a single component configuration record (single CCR); and a group component configuration records (group CCR).

19. The system of claim 18, wherein the single CCR comprises:

a vendor name of a software component; and a vendor identifier of the software component.

20. The system of claim 18, wherein the group CCR comprises:

a description of the group of components represent by the group CCR;

a vendor name of the group CCR; and a vendor identifier of the group CCR.

21. The system of claim 14, wherein the system profile comprises:

software components specific to the hardware test module versions;

user software development kits (user SDKs); and vendor software development kits (vendor SDKs).

22. The system of claim 21, wherein the software components specific to the hardware test module versions comprise:

device drivers;

emulation software components;

calibration software components; and diagnostic software components.

* * * * *